(12) United States Patent
Qing et al.

(10) Patent No.: US 12,219,743 B2
(45) Date of Patent: Feb. 4, 2025

(54) DISPLAY MODULE AND ELECTRONIC DEVICE

(71) Applicants: Chengdu BOE Optoelectronics Technology Co., Ltd., Sichuan (CN); BOE Technology Group Co., Ltd., Beijing (CN)

(72) Inventors: Xin Qing, Beijing (CN); Li Zeng, Beijing (CN); Qiang Tang, Beijing (CN); Linhuan Yan, Beijing (CN); Liang Chen, Beijing (CN); Jinglei Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/023,269

(22) PCT Filed: Jun. 17, 2022

(86) PCT No.: PCT/CN2022/099519
§ 371 (c)(1),
(2) Date: Feb. 24, 2023

(87) PCT Pub. No.: WO2023/240614
PCT Pub. Date: Dec. 21, 2023

(65) Prior Publication Data
US 2024/0276687 A1      Aug. 15, 2024

(51) Int. Cl.
*H05K 7/20* (2006.01)
(52) U.S. Cl.
CPC .............................. *H05K 7/20963* (2013.01)
(58) Field of Classification Search
CPC ..................... H05K 7/20954; H05K 7/20963
See application file for complete search history.

(56) References Cited

U.S. PATENT DOCUMENTS

2022/0305753 A1*  9/2022  Jung .................... B32B 38/10
2023/0015124 A1*  1/2023  Ryu ..................... G02F 1/132

* cited by examiner

*Primary Examiner* — Anne M Hines
(74) *Attorney, Agent, or Firm* — WHDA, LLP

(57) ABSTRACT

A display module and an electronic device are provided. The display module includes a display film layer, a heat dissipation film layer, a support plate and an elastic thermal conductive sheet. The display film layer and the heat dissipation film layer include a flat area and bending areas, and an angle exists between a tangent of a curved surface formed by the bending areas and a plane where the flat area is located. The display film layer is stacked on a first surface of the heat dissipation film layer. The support plate is connected to a position where the flat area of a second surface of the heat dissipation film layer is located, and the elastic thermal conductive sheet is connected to a position where the bending areas of the second surface of the heat dissipation film layer are located. The first surface and the second surface are opposite surfaces.

20 Claims, 3 Drawing Sheets

DISPLAY MODULE AND ELECTRONIC DEVICE

TECHNICAL FIELD

The present disclosure relates to the technical field of display devices, in particular to a display module and an electronic device.

BACKGROUND

With the continuous development of the display module, the display module is increasingly developing towards thinner and lighter screens, wide viewing angles, flexible displays, and low power consumption. At present, flexible display modules need to be used in complex working conditions such as vehicles or machine tools.

However, since there is an angle between the flat area and the bending area of the display module, when being used in complex working conditions such as vehicles or machine tools, the flexible display module is easily damaged due to insufficient strength or insufficient heat dissipation of the display module, thereby reducing the service life of the display module.

SUMMARY

Embodiments of the present disclosure provide a display module and an electronic device.

The present disclosure is implemented as follows:

In a first aspect, embodiments of the present disclosure provide a display module including a display film layer, a heat dissipation film layer, a support plate and an elastic thermal conductive sheet; the display film layer and the heat dissipation film layer include a flat area and bending areas located on both sides of the flat area, and an angle exists between a tangent of a curved surface formed by each of the bending areas and a plane where the flat area is located; the display film layer is stacked on a first surface of the heat dissipation film layer; the support plate is connected to a position where the flat area of a second surface of the heat dissipation film layer is located, and the elastic thermal conductive sheet is connected to a position where the bending areas of the second surface of the heat dissipation film layer are located; the first surface and the second surface are two opposite surfaces of the heat dissipation film layer.

Optionally the elastic thermal conductive sheet is covered by the heat dissipation film layer, and a gap exists between a projection of the elastic thermal conductive sheet on the heat dissipation film layer along a first direction and an edge of the heat dissipation film layer, and the first direction is a direction perpendicular to the tangent of each of the bending areas.

Optionally the gap between the projection of the elastic thermal conductive sheet on the heat dissipation film layer along the first direction and the edge of the heat dissipation film layer is greater than or equal to 0.5 mm and less than or equal to 1 mm.

Optionally, the elastic thermal conductive sheet is bonded to the bending areas of the second surface of the heat dissipation film layer through thermal conductive adhesive.

Optionally, the support plate is bonded to the flat area of the second surface of the heat dissipation film layer through thermal conductive adhesive.

Optionally the support plate is an aluminum plate.

Optionally the elastic thermal conductive sheet is a thermal conductive silicone sheet.

Optionally, the display module includes a cover plate, a polarizer, a touch panel, and a display panel; the display panel is stacked on the heat dissipation film layer, the touch panel is stacked on the display panel, the polarizer is stacked on the touch panel, and the cover plate is stacked on the polarizer.

Optionally the heat dissipation film layer includes an insulating layer and a conductive layer; the display panel is stacked on the insulation layer, the insulation layer covers the conductive layer, and the conductive layer is bonded to the support plate through the thermal conductive silica gel.

In a second aspect, embodiments of the present disclosure further provide an electronic device including the display module described in any embodiment described in the first aspect.

Optionally, the electronic device further includes a main body of the device; the main body of the device and the support plate are connected through thermal conductive silicone grease.

Optionally the elastic thermal conductive sheet is connected to the main body of the device through thermal conductive silicone grease.

Optionally, gaps exist between the thermal conductive silicone grease and the main body of the device as well as between the thermal conductive silicone grease and the elastic thermal conductive sheet.

Optionally, the gap between the thermal conductive silicone grease and the elastic thermal conductive sheet is greater than or equal to 0.5 mm and less than or equal to 1 mm.

Optionally the display film layer and the main body of the device are connected through elastic sealant.

BRIEF DESCRIPTION OF THE DRAWINGS

In order to clearly explain technical solutions of embodiments of the present disclosure or the related art, drawings required in the description of the embodiments or the related art are briefly introduced below. Apparently, the drawings in the following description are only some embodiments of the present disclosure. For those skilled in the art, other drawings can be obtained based on these drawings without paying creative work.

LIST OF REFERENCE SIGNS

1: display film layer; 2: heat dissipation film layer; 3: support plate; 4: elastic thermal conductive sheet; 5: thermal conductive adhesive; 6: main body; 7: thermal conductive silicone grease; 8: elastic sealant; 11: cover plate; 12: polarizer; 13: display panel; 101: flat area; 102: bending area.

DETAILED DESCRIPTION OF THE EMBODIMENTS

The technical solutions of the embodiments of the present application will be clearly and thoroughly described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

It should be understood that reference throughout the specification to "one embodiment" or "an embodiment" means that particular features, structures or characteristics related to the embodiment are included in at least one embodiment of the present disclosure. Thus, phrases "in one embodiment" or "in an embodiment" as used in various places throughout the specification are not necessarily referring to the same embodiment. Furthermore, the particular features, structures or characteristics may be combined in any suitable manner in one or more embodiments.

Figure 1:
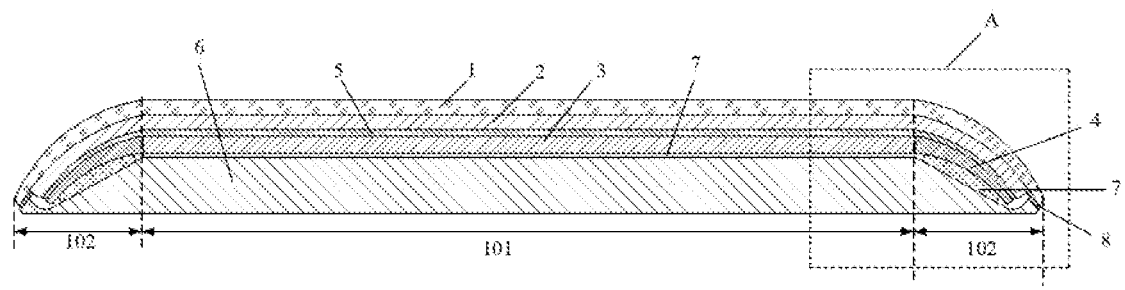
FIG. 1 is a schematic structural diagram of a display module provided by an embodiment of the present disclosure.
Figure 2:
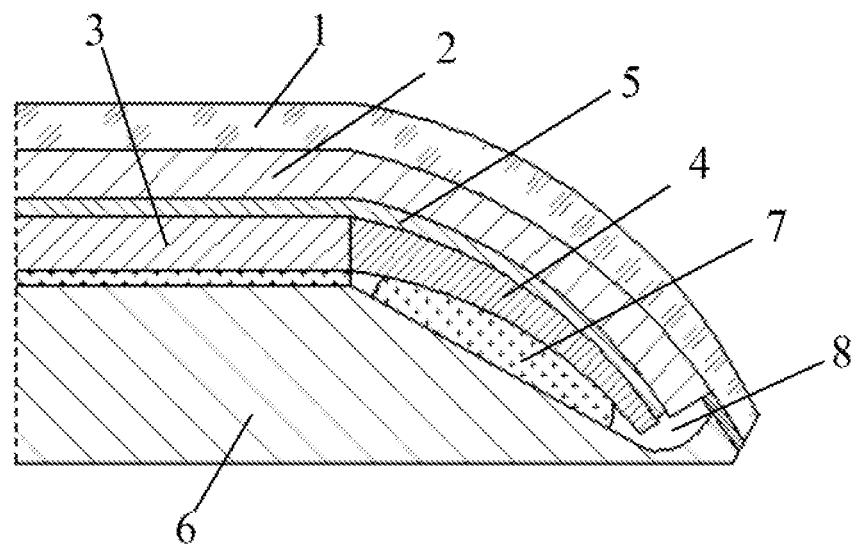
FIG. 2 is a partial enlarged schematic diagram illustrating part 'A' in the display module of FIG. 1 provided by an embodiment of the present disclosure.
Figure 3:
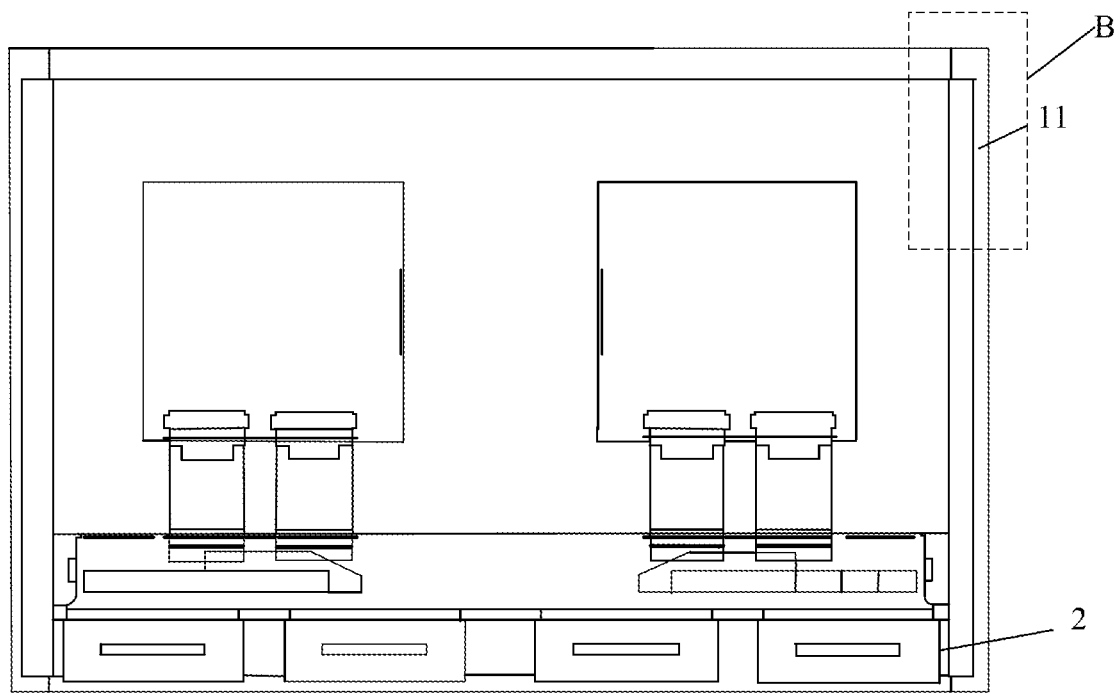
FIG. 3 is a front view of a display module provided by an embodiment of the present disclosure.
Figure 4:
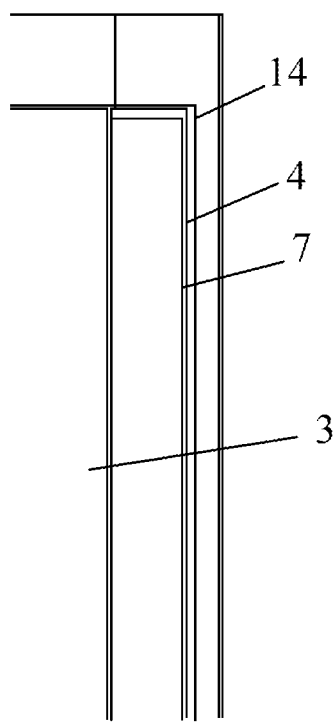
FIG. 4 is a partial enlarged schematic diagram of part 'B' in the display module of FIG. 3 provided by an embodiment of the present disclosure.
Figure 5:
FIG. 5 is a top view of a display module provided by an embodiment of the present disclosure.
Figure 6:
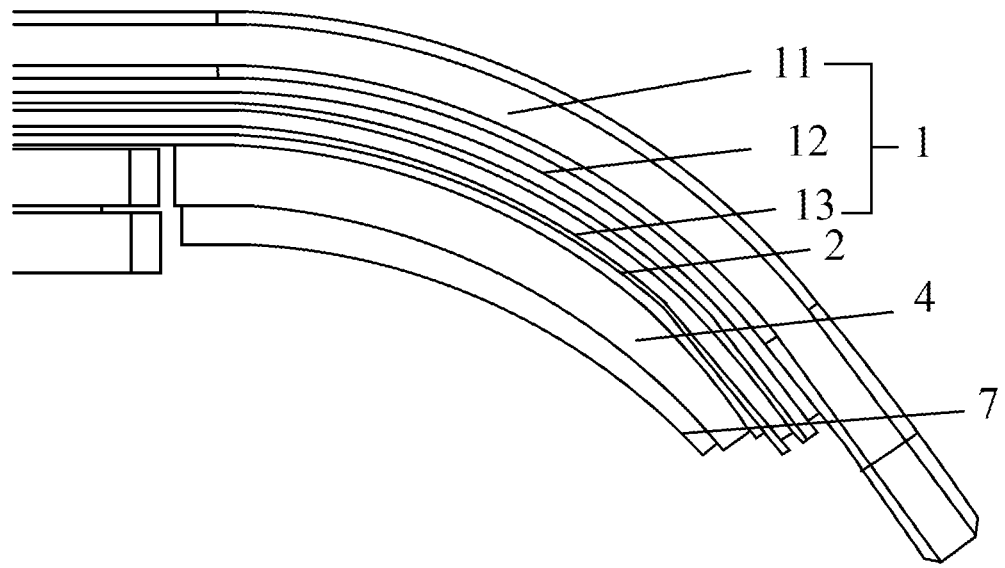
FIG. 6 is a partial enlarged schematic diagram of part 'C' in the display module of FIG. provided by an embodiment of the present disclosure.

In a first aspect, an embodiment of the present disclosure provides a display module. FIG. 1 is a schematic structural diagram of a display module provided by an embodiment of the present disclosure. FIG. 2 is a partial enlarged schematic diagram illustrating part 'A' in the display module of FIG. 1 provided by an embodiment of the present disclosure. As shown in FIG. 1 and FIG. 2, the display module includes a display film layer 1, a heat dissipation film layer 2, a support plate 3 and an elastic thermal conductive sheet 4. The display film layer 1 and the heat dissipation film layer 2 include a flat area 101 and bending areas 102 located on both sides of the flat area 101. There is an angle between a tangent line of a curved surface formed by each of the bending areas 102 and a plane where the flat area 101 is located. The display film layer 1 is stacked on a first surface of the heat dissipation film layer 2. The support plate 3 is connected to a position where the flat area 101 of a second surface of the heat dissipation film layer 2 is located, and the elastic thermal conductive sheet 4 is connected to a position where the bending areas 102 of the second surface of the heat dissipation film layer 2 are located. The first surface and the second surface are two opposite surfaces of the heat dissipation film layer 2.

The flat area 101 is an area where a flat surface in the display module is located, and the bending area 102 is an area where a curved surface in the display module is located. Generally, the bending areas 102 are located at both ends of the flat area 101, and each of the bending areas is bent along a direction away from the flat area 101 to form a curved surface, thereby increasing the display area of the display module. In the embodiment of the present disclosure, there is an angle between the tangent of the bending region 102 and the plane where the flat region 101 is located, that is, there is an angle between the tangent of the curved surface formed by the bending region 102 and the plane where the flat region 101 is located.

Since there is an angle between the tangent of the curved surface formed by the bending area 102 and the plane where the flat area 101 is located, a shear force exists between the bending area 102 and the flat area 101, thereby reducing the overall strength of the display module. In order to improve the strength of the display module, in the embodiment of the present disclosure, the support plate 3 is connected to the flat area 101 of the second surface of the heat dissipation film layer 2. The support plate 3 may be a plate made of metal materials having certain strength and capable of conducting heat, such as copper, aluminum iron which is not limited in the embodiments of the present disclosure.

Furthermore, the support plate 3 is difficult to adhere to the bending area 102 due to thickness, easily leading to uneven heat dissipation between the bending area 102 and the flat area 101. Accordingly, when the display module is in a high-temperature operating environment, undesirable phenomena such as yellowing are easy to occur in the bending area 102. In order to avoid this problem, in the embodiment of the present disclosure, as shown in FIG. 2, the display module further includes the elastic thermal conductive sheet 4. The elastic thermal conductive sheet 4 is connected to the bending area 102 of the second surface of the heat dissipation film layer 2. In this way, the heat in the bending area 102 can be conducted through the elastic thermal conductive sheet 4, so that both the bending area 102 and the flat area 101 have components for heat dissipation. Therefore, the heat dissipation of the bending area 102 and the flat area 101 is uniform, thereby avoiding undesirable phenomena such as yellowing in the bending area 102.

It should be noted that the elastic thermal conductive sheet 4 may have a material with certain elasticity and good heat-conducting performance, such as thermal conductive silicone and thermal conductive rubber, which is not limited in the embodiments of the present disclosure.

It can be seen from the above embodiments that, in the embodiments of the present disclosure, the display film layer 1 is stacked on the first surface of the heat dissipation film layer 2, the support plate 3 is connected to a position where the flat area 101 of the second surface of the heat dissipation film layer 2 is located, so that the flat area 101 of the heat dissipation film layer 2 can be supported by the support plate 3, and the shear force between the flat area 101 and the bending area 102 can be further reduced through the support plate 3. Therefore the heat dissipation function of the flat area 101 can be improved through the support plate 3 while the strength of the display module is improved. In addition, the elastic thermal conductive sheet 4 is connected to the position, where the bending area 102 is located, of the second surface of the heat dissipation film layer 2. By connecting the elastic thermal conductive sheet 4 to the bending area 102 of the second surface of the heat dissipation film layer 2, the heat in the bending area 102 can be conducted, so that both the bending area 102 and the flat area 101 have components for heat dissipation. Therefore heat dissipation in the bending area 102 and the flat area 101 is uniform, thereby avoiding undesirable phenomena such as yellowing in the bending area 102. To sum up, the display module provided by the embodiments of the present disclosure can not only improve the strength of the display module, but also improve the heat dissipation performance of the display module, and the service life of the display module can be further prolonged.

In some embodiments, the support plate 3 is an aluminum plate. On the one hand, the aluminum plate can enhance the strength of the display module and provide sufficient support for the flat area 101 of the display module. On the other hand, since the density of the aluminum plate is lower compared with metal plates such as the copper plate and the iron plate, the weight of the support plate 3 can be reduced to a certain extent, which is beneficial to the lightweight design of the display module.

It should be noted that the first surface and the second surface are two opposite surfaces of the heat dissipation film layer 2, and the first surface is a surface attached to the back surface of the display film layer 1, the back surface of the display film layer 1 being a surface opposite to a light emitting surface of the display film layer 1.

In some embodiments, the support plate 3 is bonded to the flat area 101 of the second surface of the heat dissipation film layer 2 through a thermal conductive adhesive 5. In this way, the heat in the heat dissipating film layer 2 can be transferred to the support plate through the thermal conductive adhesive 5, and then transferred to the outside through the support plate. Since the display film layer 1 is stacked on the first surface of the heat dissipation film layer 2, a heat dissipation path from the display film layer 1 to the heat dissipation film layer 2, and then to the support plate 3 can be established, thereby effectively avoiding the heat accumulation of the display film layer 1, and improving the display effect of the display film layer 1.

In some embodiments the elastic thermal conductive sheet 4 is a thermal conductive silicone sheet. Since the thermal conductive silicone sheet has high thermal conductivity, excellent heat-conducting property, good electrical insulation, wide service temperature, and good service stability low consistency and good construction performance after the thermal conductive silicone sheet is arranged in the bending area 102 of the second surface of the heat dissipation film layer 2, the heat dissipation in the bending area 102 is achieved, meanwhile, due to the thermoplasticity and elasticity of the thermal conductive silicone sheet itself, it is convenient to assemble the display module on other parts, and when assembling a sufficient installation margin can be reserved through the thermal conductive silicone sheet.

Further, the heat dissipation film layer 2 covers the elastic thermal conductive sheet 4, and there is a gap between a projection of the elastic thermal conductive sheet 4 on the heat dissipation film layer 2 along the first direction and an edge of the heat dissipation film layer 2.

It should be noted that there is a gap between the projection of the elastic thermal conductive sheet 4 on the heat dissipation film layer 2 along the first direction and the edge of the heat dissipation film layer 2, that is, the end of the elastic thermal conductive sheet 4 and the end of the heat dissipation film layer 2 are misplaced, in other words, the end of the thermal conductive sheet 4 shrinks inward by a certain distance relative to the end of the heat dissipation film layer 2. In this way, the heat dissipation film layer 2 can completely cover the elastic thermal conductive sheet 4, on the one hand, it is beneficial to the heat transferring of the heat dissipation film layer 2 and on the other hand a certain installation margin can be provided through the elastic thermal conductive sheet 4, thereby facilitating the assembly of the elastic thermal conductive sheet 4 and the heat dissipation film layer 2 as well as other parts.

Specifically, a gap greater than or equal to 0.5 mm and less than or equal to 1 mm exists between the projection of the elastic thermal conductive sheet 4 on the heat dissipation film layer 2 along the first direction and the edge of the heat dissipation film layer 2. In this way, sufficient installation tolerance can be reserved for the bonding between the elastic thermal conductive sheet 4 and the heat dissipation film layer 2, so as to ensure the tightness of the bonding between the elastic thermal conductive sheet 4 and the heat dissipation film layer 2.

Optionally, the elastic thermal conductive sheet 4 is bonded to the bending area 102 of the second surface of the heat dissipation film layer 2 through the thermal conductive adhesive 5. In this way, the heat in the heat dissipation film layer 2 can be transferred to the elastic thermal conductive sheet 4 through the thermal conductive adhesive 5, and then transferred to the outside by the elastic thermal conductive sheet 4. Since the display film layer 1 is stacked on the first surface of the heat dissipation film layer 2, a heat dissipation path from the display film layer 1 to the heat dissipation film layer 2, and then to the elastic thermal conductive sheet 3 can be established, thereby effectively avoiding the heat accumulation of the display film layer 1, and improving the display effect of the display film layer 1.

Furthermore, as shown in FIG. 3, FIG. 4, FIG. 5 and FIG. 6, the display module includes a cover plate 11, a polarizer 12, a touch panel, and a display panel 13. The display panel 13 is stacked on the heat dissipation film layer 2, the touch panel is stacked on the display panel 13, the polarizer 12 is stacked on the touch panel, and the cover plate 1I is stacked on the polarizer 12.

It should be noted that the cover plate is mainly configured to protect the display panel 13, and light is allowed to pass through the cover plate. The cover plate should have thermal stability and chemical stability. If it is necessary to control the overall weight of the display module, the thickness of the cover plate and the density of the transparent cover plate can be appropriately reduced. The cover plate may be a transparent glass cover plate, an acrylic plate, or a cover plate made of other materials, which is not limited in the embodiments of the present disclosure. The polarizer 12 is mainly configured to dissipate the surface reflection of the display panel, and make the light scatter to increase the viewing angle of the display module. The touch panel is mainly configured to realize the touch function of the display module. In some embodiments, the display module may not include the polarizer 12 and the touch panel, or the display module may include the polarizer but not the touch panel. When the display module is applied in an application environment requiring the touch function, it may include a touch panel. Embodiments of the present disclosure do not limit this.

It should also be noted that since the display panel 13 is stacked on the heat dissipation film layer 2, the touch panel is stacked on the display panel 13, the polarizer 12 is stacked on the touch panel, and the cover plate 11 is stacked on the polarizer 12, the heat in each layer in the display film layer 1 can be transferred to the heat dissipation film layer 2, and finally transferred to the outside through the support plate and the elastic thermal conductive sheet 4, thereby improving the heat dissipation function of the display module.

In some embodiments, the heat dissipation film layer 2 includes an insulation layer and a conductive layer; the display panel 13 is stacked on the insulation layer, the insulation layer covers the conductive layer and the conductive layer is bonded to the support plate through the thermal conductive silicone.

Specifically, the insulation layer may include foam, a grid adhesive layer and a polyimide film. The foam is covered on a surface of the display panel 13 opposite to the light-emitting surface. The grid adhesive layer is disposed between the polyimide film and the foam. The foam can be a low-density foam layer with many small holes, which is conducive to the rapid heat dissipation and can provide a certain buffer for the display panel 13, thereby reducing the damage to the display panel 13 when the heat dissipation film layer 2 is provided. The conductive layer can be a conductive copper layer, and the conductive copper layer covers the polyimide film. Since the conductive layer is bonded to the support plate through the thermal conductive silicone, charges can be transferred through the conductive layer while ensuring the tight fit of various layers, and the heat in the conductive layer can be transferred to the outside through the support plate.

As can be seen from the above embodiments, in the embodiments of the present disclosure, the display film layer 1 is stacked on the first surface of the heat dissipation film layer 2, the support plate 3 is connected to a position where the flat area 101 of the second surface of the heat dissipation film layer 2 is located, so that the flat area 101 of the heat dissipation film layer 2 can be supported by the support plate 3, and the shear force between the flat area 101 and the bending area 102 can be further reduced through the support plate 3. Therefore the heat dissipation function of the flat area 101 can be improved through the support plate 3 while the strength of the display module is improved. In addition, the elastic thermal conductive sheet 4 is connected to the position where the bending area 102 of the second surface of the heat dissipation film layer 2 is located. Therefore, by connecting the elastic thermal conductive sheet 4 to the bending area 102 of the second surface of the heat dissipation film layer 2, the heat in the bending area 102 can be conducted, so that both the bending area 102 and the flat area 101 have components for heat dissipation. Therefore, heat dissipation in the bending area 102 and the flat area 101 is uniform thereby avoiding undesirable phenomena such as yellowing in the bending area 102. To sum up the display module provided by the embodiments of the present disclosure can not only improve the strength of the display module, but also improve the heat dissipation performance of the display module, and the service life of the display module can be further prolonged.

In a second aspect, an embodiment of the present disclosure further provides an electronic device including the display module described in any one of the above embodiments.

It should be noted that the electronic device may be a mobile electronic device such as a mobile phone, a tablet computer, a notebook computer, a handheld computer, a vehicle-mounted electronic device, a wearable device, an ultra-mobile personal computer (UMPC), a netbook or a personal digital assistant (PDA). A non-mobile electronic device may be a personal computer (PC), a television (TV), an automated teller machine, or a self-service machine, etc., which are not specifically limited in the embodiments of the present disclosure.

It should be noted, in the case where the electronic device includes the display module, the display module provided by the embodiments of the present disclosure can improve the heat dissipation performance of the display module while improving the strength of the display module, and the service life of the display module is further prolonged, so that the application range of the display module when applied to the electronic device is further expanded. Therefore, the usage scenarios of the electronic device are not limited by the performance of the display module. Exemplarily, when the display module included in the electronic device is applied to a floating touch screen of a car, since the strength and heat dissipation performance of the display module are improved, the floating touch screen can not only achieve better visual effects, but also can have strength and heat dissipation performance, which can make full use of the advantages of the bending area of the display module and broaden the application scenarios of the display module.

In some embodiments, the electronic device further includes a main body 6, and the main body 6 and the support plate 3 are connected through thermal conductive silicone grease 7. It should be noted that, since the main body 6 and the support plate 3 are connected through the thermal conductive silicone grease 7, the heat transferred to the support plate 3 from the display module can be transferred to the outside of the main body 6 through the thermal conductive silicone grease 7 and the connection between the flat area 101 of the display module and the main body 6 of the device is achieved through thermal conductive silicone grease 7.

Further the display module further includes the elastic thermal conductive sheet 4, the elastic thermal conductive sheet 4 is connected to the bending area 102 of the second surface of the heat dissipation film layer 2, and the elastic thermal conductive sheet 4 is connected to the main body 6 through the thermal conductive silicone grease 7.

Similarly, the elastic thermal conductive sheet 4 is connected to the main body 6 through the thermal conductive silicone grease 7, so that the heat transferred to the elastic thermal conductive sheet 4 from the display module can be transferred to the outside of the main body 6 through the thermal conductive silicone grease 7, and the connection between the bending area 102 of the display module and the main body 6 is achieved through the thermal conductive silicone grease 7.

Optionally, gaps exist between the thermal conductive silicone grease 7 and the main body 6 as well as between the thermal conductive silicone grease 7 and the elastic thermal conductive sheet 4. It should be noted that when there are gaps between the thermal conductive silicone grease 7 and the main body 6 as well as between the thermal conductive silicone grease 7 and the elastic thermal conductive sheet 4, due to certain elasticity and thermoplasticity of the thermal conductive silicone grease 7, on the one hand there is an installation allowance for the connection between the main body 6 and the display module, which facilitates installation and reduces damage to the structure of the display module during assembly. On the other hand, by providing gaps between the thermal conductive silicone grease 7 and the main body 6 as well as between the thermal conductive silicone grease 7 and the elastic thermal conductive sheet 4, a certain space is provided for the expansion and contraction of the thermal conductive silicone grease 7 avoiding a protrusion, caused by the expansion of the thermal conductive silicon grease 7, on the curved surface where the bending area 102 of the display module is located, thereby ensuring the display effect of the display module.

Further, the gap between the thermal conductive silicone grease 7 and the elastic thermal conductive sheet 4 is greater than or equal to 0.5 mm and less than or equal to 1 mm. In this way, sufficient installation tolerance can be reserved for the bonding between the thermal conductive silicone grease 7 and the elastic thermal conductive sheet 4, so as to ensure the tightness of bonding between the thermal conductive silicone grease 7 and the elastic thermal conductive sheet 4.

In some embodiments, the display film layer 1 and the main body 6 are connected through an elastic sealant 8. The elastic sealant can be an adhesive with certain elasticity, such as foam tape, epoxy resin sealant, or the like. In this way, by connecting the display film layer 1 and the main body 6 through the elastic sealant 8, the heat of the display module can be transferred through the elastic sealant 8 to facilitate the heat dissipation of the display module while completing the entire assemble of the electronic device. Meanwhile, since the elastic sealant 8 has a certain elasticity the elastic sealant 8 can provide a certain buffer for the bending area 102 of the display module, thereby avoiding structural damage to the bending area 102 of the display module when it is subjected to a large stress, and prolonging the service life of the display module.

As can be seen from the above embodiments, in the embodiments of the present disclosure, the support plate and the elastic thermal conductive sheet can be connected to the main body 6 of the device through the thermal conductive silicone grease 7, and then the display film layer 1 and the main body 6 of the device can be connected through the elastic sealant 8. In this way, while improving the strength of the display module of the electronic device, it can facilitate the heat dissipation of the display module and prolong the service life of the electronic device.

It should be noted that various embodiments in the specification are described in a progressive manner, each embodiment focuses on the difference from other embodiments, and the same and similar parts of various embodiments can be referred to each other.

Although optional embodiments of the present disclosure have been described, additional changes and modifications to these embodiments may be made by those skilled in the art once the basic creative concept is appreciated. Therefore the appended claims are intended to be construed to cover optional embodiments and all changes and modifications that fall within the scope of the disclosed embodiments.

Finally, it should also be noted that relational terms such as "first" and "second" as used herein are only used to distinguish one entity from another without necessarily requiring or implying any actual such relationship or order between such entities. Furthermore, the terms "comprises", "comprising", or any other variation thereof are intended to cover a non-exclusive inclusion, such that an article, or equipment that includes a list of elements not only includes those elements but also includes other elements not expressly listed or elements inherent to such article, or equipment. An element defined by the phrase "including one" does not, without more constraints, preclude the existence of additional identical elements in the article, or equipment that includes the element.

The technical solutions provided by the present disclosure have been introduced in details above. Herein, specific examples are used to illustrate the principles and implementation methods of the present disclosure. Meanwhile for those skilled in the art, changes in specific implementation methods and application scopes may be made based on the principles and implementation methods of the present disclosure. To sum up, the contents of this specification should not be construed as limiting the present disclosure.

The invention claimed is:

1. A display module, comprising a display film layer, a heat dissipation film layer, a support plate and an elastic thermal conductive sheet;
   wherein the display film layer and the heat dissipation film layer comprise a flat area and bending areas located on both sides of the flat area, and an angle exists between a tangent of a curved surface formed by each of the bending areas and a plane where the flat area is located;
   the display film layer is stacked on a first surface of the heat dissipation film layer;
   the support plate is connected to a position where the flat area of a second surface of the heat dissipation film layer is located, and the elastic thermal conductive sheet is connected to a position where the bending areas of the second surface of the heat dissipation film layer are located;
   wherein the first surface and the second surface are two opposite surfaces of the heat dissipation film layer.

2. The display module according to claim 1, wherein the elastic thermal conductive sheet is covered by the heat dissipation film layer, and a gap exists between a projection of the elastic thermal conductive sheet on the heat dissipation film layer along a first direction and an edge of the heat dissipation film layer, wherein the first direction is a direction perpendicular to the tangent of each of the bending areas.

3. The display module according to claim 2, wherein the gap between the projection of the elastic thermal conductive sheet on the heat dissipation film layer along the first direction and the edge of the heat dissipation film layer is greater than or equal to 0.5 mm and less than or equal to 1 mm.

4. The display module according to claim 1, wherein the elastic thermal conductive sheet is bonded to the bending areas of the second surface of the heat dissipation film layer through thermal conductive adhesive.

5. The display module according to claim 1, wherein the support plate is bonded to the flat area of the second surface of the heat dissipation film layer through thermal conductive adhesive.

6. The display module according to claim 1, wherein the support plate is an aluminum plate.

7. The display module according to claim 1, wherein the elastic thermal conductive sheet is a thermal conductive silicone sheet.

8. The display module according to claim 1, wherein the display module comprises a cover plate, a polarizer, a touch panel, and a display panel;
   wherein the display panel is stacked on the heat dissipation film layer, the touch panel is stacked on the display panel, the polarizer is stacked on the touch panel, and the cover plate is stacked on the polarizer.

9. The display module according to claim 8, wherein the heat dissipation film layer comprises an insulating layer and a conductive layer;
   wherein the display panel is stacked on the insulation layer, the insulation layer covers the conductive laver, and the conductive layer is bonded to the support plate through the thermal conductive silica gel.

10. An electronic device, comprising a display module, wherein the display module comprises: a display film layer, a heat dissipation film laver, a support plate and an elastic thermal conductive sheet:
   wherein the display film layer and the heat dissipation film layer comprise a flat area and bending areas located on both sides of the flat area, and an angle exists between a tangent of a curved surface formed by each of the bending areas and a plane where the flat area is located;
   the display film layer is stacked on a first surface of the heat dissipation film layer;
   the support plate is connected to a position where the flat area of a second surface of the beat dissipation film layer is located, and the elastic thermal conductive sheet is connected to a position where the bending areas of the second surface of the heat dissipation film layer are located;
   wherein the first surface and the second surface are two opposite surfaces of the heat dissipation film layer.

11. The electronic device according to claim 10, wherein the electronic device further comprises a main body of the device;
wherein the main body the device and the support plate are connected through thermal conductive silicone grease.

12. The electronic device according to claim 10, wherein the elastic thermal conductive sheet is connected to the main body of the device through thermal conductive silicone grease.

13. The electronic device according to claim 12, wherein gaps exist between the thermal conductive silicone grease and the main body of the device as well as between the thermal conductive silicone grease and the elastic thermal conductive sheet.

14. The electronic device according to claim 13, wherein the gap between the thermal conductive silicone grease and the elastic thermal conductive sheet is greater than or equal to 0.5 mm and less than or equal to 1 mm.

15. The electronic device according to claim 10, wherein the display film layer and the main body of the device are connected through elastic sealant.

16. The electronic device according to claim 10, wherein the elastic thermal conductive sheet is covered by the heat dissipation film layer, and a gap exists between a projection of the elastic thermal conductive sheet on the beat dissipation film layer along a first direction and an edge of the heat dissipation film layer, wherein the first direction is a direction perpendicular to the tangent of each of the bending areas.

17. The electronic device according to claim 16, wherein the gap between the projection of the elastic thermal conductive sheet on the heat dissipation film layer along the first direction and the edge of the heat dissipation film layer is greater than or equal to 0.5 mm and less than or equal to 1 mm.

18. The electronic device according to claim 10, wherein the elastic thermal conductive sheet is bonded to the bending areas of the second surface of the heat dissipation film layer through thermal conductive adhesive.

19. The electronic device according to claim 10, wherein the support plate is bonded to the flat area of the second surface of the heat dissipation film layer through thermal conductive adhesive.

20. The electronic device according to claim 10, wherein the support plate is an aluminum plate.

* * * * *